(12) United States Patent
Halasyamani et al.

(10) Patent No.: US 10,409,138 B2
(45) Date of Patent: Sep. 10, 2019

(54) NONLINEAR OPTICAL MATERIAL AND METHODS OF FABRICATION

(71) Applicant: University of Houston System, Houston, TX (US)

(72) Inventors: P. Shiv Halasyamani, Houston, TX (US); Hongwei Yu, Houston, TX (US)

(73) Assignee: UNIVERSITY OF HOUSTON SYSTEM, Houston, TX (US)

(*) Notice: Subject to any disclaimer, the term of this patent is extended or adjusted under 35 U.S.C. 154(b) by 0 days.

(21) Appl. No.: 16/357,640

(22) Filed: Mar. 19, 2019

(65) Prior Publication Data

US 2019/0212630 A1  Jul. 11, 2019

Related U.S. Application Data

(62) Division of application No. 16/120,366, filed on Sep. 3, 2018, now Pat. No. 10,281,796, which is a division of application No. 15/563,903, filed as application No. PCT/US2016/027303 on Apr. 13, 2016, now Pat. No. 10,133,148.

(60) Provisional application No. 62/146,693, filed on Apr. 13, 2015.

(51) Int. Cl.
| | |
|---|---|
| *G02F 1/355* | (2006.01) |
| *G02F 1/37* | (2006.01) |
| *G02F 1/35* | (2006.01) |
| *C30B 29/10* | (2006.01) |
| *C30B 17/00* | (2006.01) |
| *C30B 1/00* | (2006.01) |
| *H01S 5/00* | (2006.01) |

(52) U.S. Cl.
CPC .............. *G02F 1/3551* (2013.01); *C30B 1/00* (2013.01); *C30B 17/00* (2013.01); *C30B 29/10* (2013.01); *G02F 1/35* (2013.01); *G02F 1/37* (2013.01); *H01S 5/0092* (2013.01)

(58) Field of Classification Search
CPC ....... G02F 1/355; G02F 1/3551; H01S 5/0092
See application file for complete search history.

(56) References Cited

U.S. PATENT DOCUMENTS

| | | | |
|---|---|---|---|
| 4,532,000 A | 7/1985 | Harrington et al. | |
| 5,343,327 A | 8/1994 | Chai et al. | |
| 6,146,553 A | 11/2000 | Wu et al. | |
| 6,391,229 B1 * | 5/2002 | Watanabe | C01B 35/121 117/73 |
| 6,921,498 B2 | 7/2005 | Wu et al. | |

(Continued)

OTHER PUBLICATIONS

PCT/US2016/027303 International Search Report and Written Opinion dated Aug. 30, 2016 (17 p.).

(Continued)

*Primary Examiner* — Daniel Petkovsek
(74) *Attorney, Agent, or Firm* — Conley Rose, P.C.

(57) ABSTRACT

Disclosed is a nonlinear optical (NLO) material for use in deep-UV applications, and methods of fabrication thereof. The NLO is fabricated from a plurality of components according to the formula $A_qB_yC_z$ and a crystallographic non-centrosymmetric (NCS) structure. The NLO material may be fabricated as a polycrystalline or a single crystal material. In an embodiment, the material may be according to a formula $Ba_3ZnB_5PO_{14}$.

19 Claims, 16 Drawing Sheets

(56) References Cited

U.S. PATENT DOCUMENTS

| | | |
|---|---|---|
| 7,504,053 B1 | 3/2009 | Alekel |
| 9,715,160 B2 | 7/2017 | Pan et al. |
| 9,751,774 B2 | 9/2017 | Pan et al. |
| 10,133,148 B2 | 11/2018 | Halasyamani et al. |
| 2002/0166997 A1 | 11/2002 | Reynolds et al. |
| 2009/0262763 A1 | 10/2009 | Pan et al. |
| 2013/0309472 A1 | 11/2013 | Halasyamani et al. |

OTHER PUBLICATIONS

Yu, Hongwei, et al., "Design and Synthesis of the Beryllium-Free Deep-Ultraviolet Nonlinear Optical Material Ba3 (ZnBsO1O)PO4," Advanced Materials, vol. 27, Issue 45, Oct. 13, 2015, pp. 7380-7385 (6 p.).
Office Action dated Jun. 13, 2018 for U.S. Appl. No. 15/563,903 (14 p.).
Response to Office Action dated Jun. 13, 2018 for U.S. Appl. No. 15/563,903; Response filed Jun. 28, 2018 (14 p.).
Notice of Allowance dated Aug. 13, 2018 for U.S. Appl. No. 15/563,903 (11 p.).
Office Action dated Dec. 12, 2018, for U.S. Appl. No. 16/120,366 (12 p.).
Response to Office Action dated Dec. 12, 2018, for U.S. Appl. No. 16/120,366; Response filed Feb. 12, 2019 (9 p.).
Notice of Allowance dated Mar. 6, 2019, for U.S. Appl. No. 16/120,366 (10 p.).

\* cited by examiner

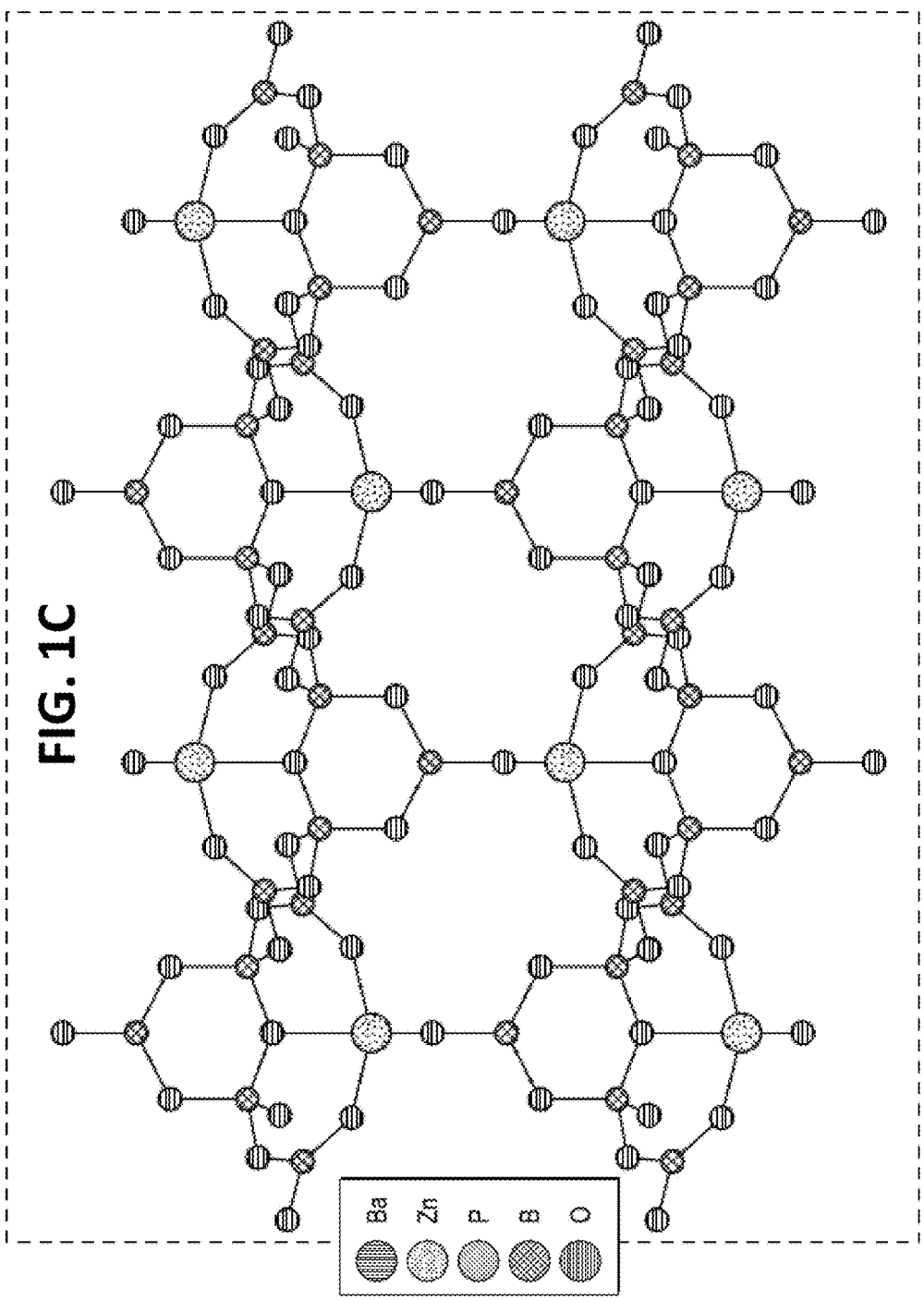

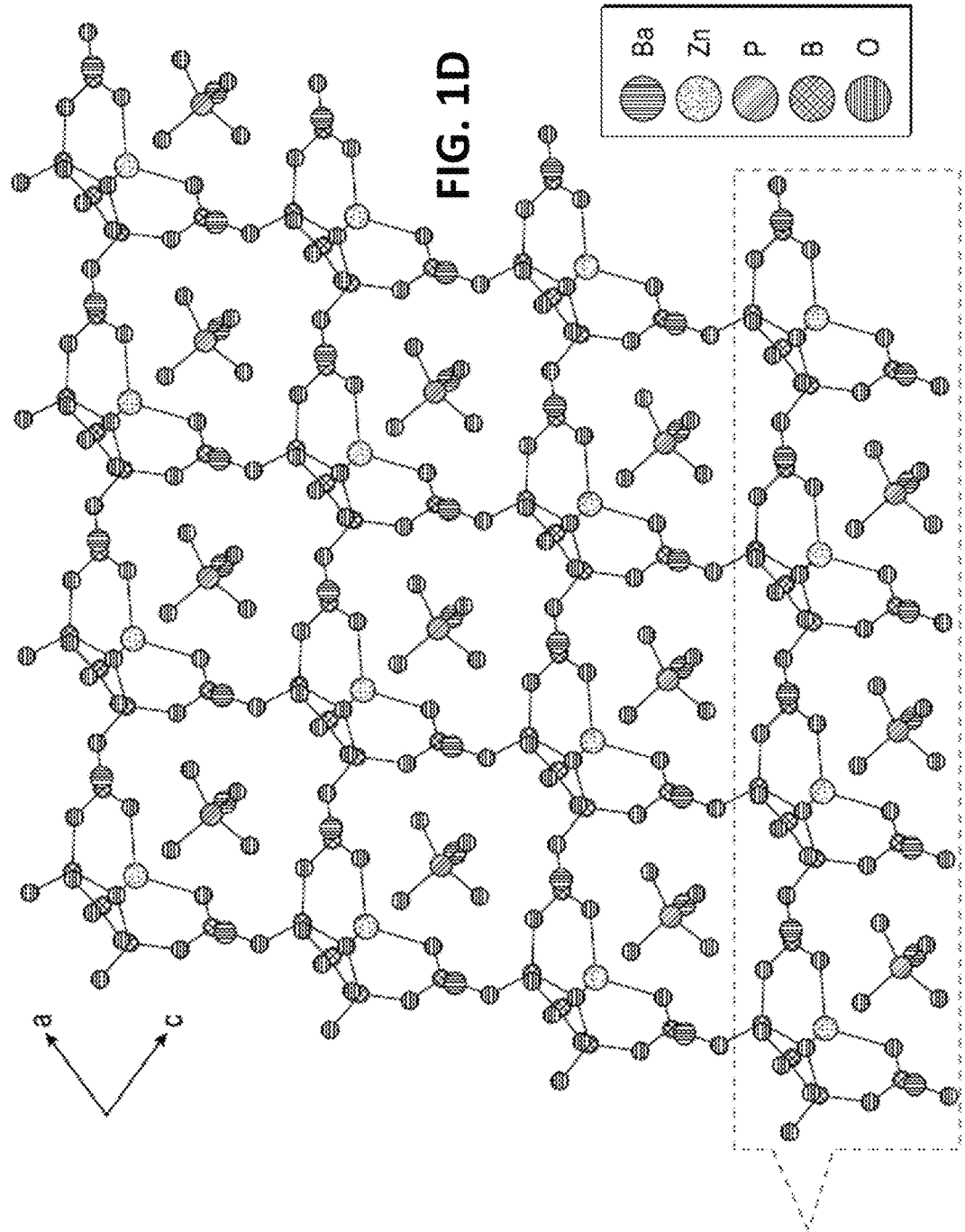

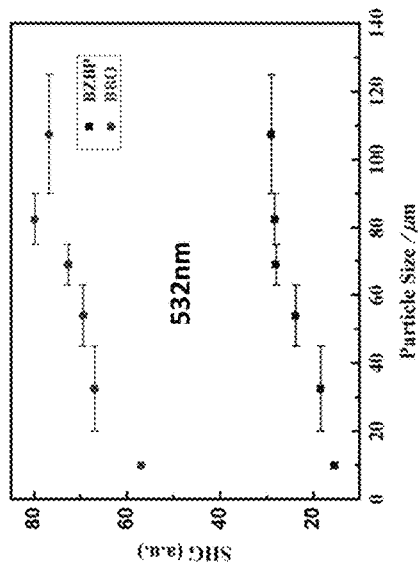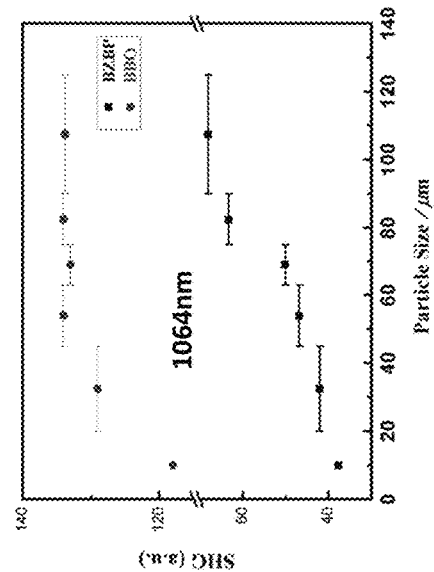

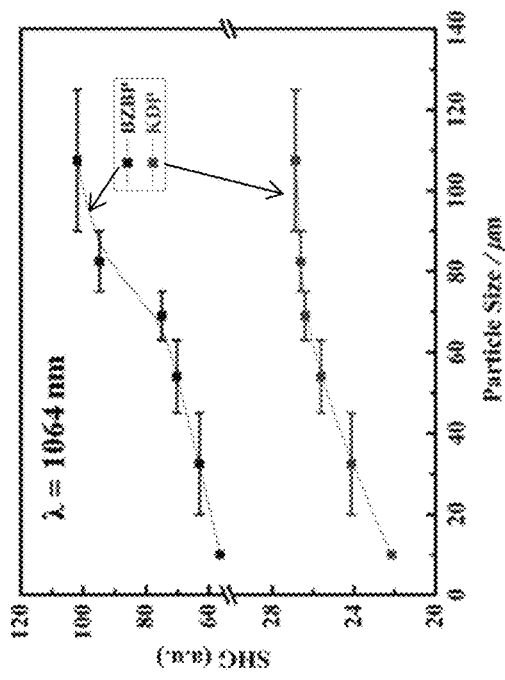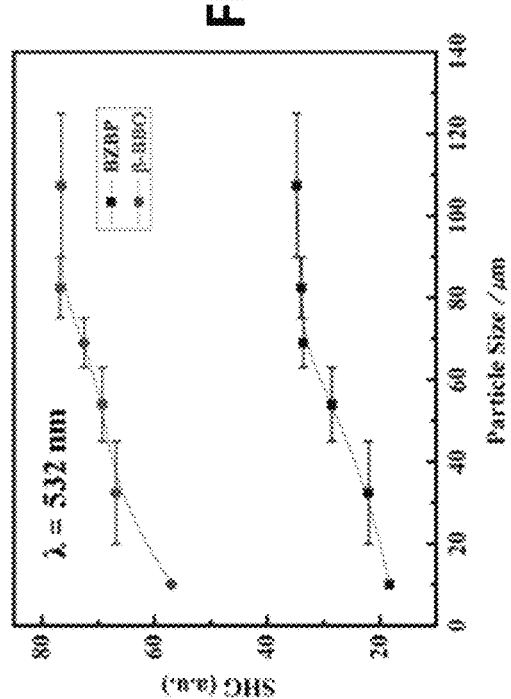

NONLINEAR OPTICAL MATERIAL AND METHODS OF FABRICATION

CROSS-REFERENCE TO RELATED APPLICATIONS

This application is a divisional application of Ser. No. 16/120,366 (now U.S. Pat. No. 10,281,796), filed Sep. 3, 2018, and entitled "Nonlinear Optical Material and Methods of Fabrication", which is a divisional application of U.S. patent application Ser. No. 15/563,903 (now U.S. Pat. No. 10,133,148), filed Oct. 2, 2017, and entitled "Nonlinear Optical Material and Methods of Fabrication", which is a 35 U.S.C. § 371 national stage application of PCT/US2016/027303, filed Apr. 13, 2016, and entitled "Nonlinear Optical Material and Methods of Fabrication", which claims priority to U.S. Patent Application No. 62/146,693, entitled "A Nonlinear Optical Material and Methods of Fabrication," filed Apr. 13, 2015, the disclosure of each of which is incorporated by reference in their entirety herein for all purposes.

STATEMENT REGARDING FEDERALLY SPONSORED RESEARCH OR DEVELOPMENT

Not applicable.

BACKGROUND

Nonlinear optical (NLO) materials may be employed for applications including optical switching and power limitation as well as image processing and manipulation. Nonlinear optical behavior is the behavior of light in nonlinear materials where the dielectric polarization has a nonlinear response to the electric field of light applied, for example, when the electric field may be of an interatomic strength. In the field of nonlinear optical materials, a solid-state laser of a specific wavelength that may be about 1064 nm (infrared), as compared to visible light which is from roughly 400 nm (blue) to 700 nm (red). The term 'solid-state laser' is used, since what is being used to lase is a Nd:YAG (neodymium-doped yttrium aluminum garnet—a solid material). When this laser light hits a NLO material, the resulting laser light is half the wavelength, i.e. 1064 nm goes in and 532 nm (green) comes out. With proper optics and a NLO crystal, a 532 nm laser may be fabricated by starting with a 1064 nm laser. This fabrication is termed second-harmonic generation (SHG)—1064 nm/2=532 nm. If another NLO crystal is disposed in front of the 532 nm light, that radiation would be halved, i.e. 532 nm/2=266 nm, or 1064 nm/4=266 nm. This is termed fourth harmonic generation (FOHG). It is appreciated that the order of the harmonic generation is based on the original wavelength of 1064 nm.

BRIEF SUMMARY OF THE DISCLOSURE

In an embodiment, a device comprising: a nonlinear optical (NLO) material according to the formula $A_qB_yC_z$ and having a crystallographic non-centrosymmetric (NCS) structure.

In an embodiment, a method of fabricating polycrystalline non-linear optical (NLO) materials comprising: heating a vessel containing a plurality of components according to a protocol, wherein the protocol comprises a plurality of portions; forming, subsequent to completing the protocol, a polycrystalline material comprising a crystallographic non-centrosymmetric (NCS) structure having an SHG at 1064 nm from about 42 a.u. to about 110 a.u.

In an embodiment, a method of fabricating an NLO material comprising: heating a vessel containing a polycrystalline non-linear optical material according to a protocol, wherein the polycrystalline material is according to a formula $A_qB_yC_z$, and wherein the material comprises crystallographic non-centrosymmetric (NCS) structure; and forming, in response to the heating according to the protocol, a plurality of single crystals from about 0.1 mm to about 10 mm in diameter.

Embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

BRIEF DESCRIPTION OF THE DRAWINGS

FIGS. 1B-1D are schematic illustrations of components and compounds that make up the BZBP fabricated according to certain embodiments of the present disclosure.

FIGS. 2A-2D illustrate the second harmonic image generation (SHG) results with respect to particle size for samples of BZBP fabricated according to certain embodiments of the present disclosure in comparison with other compounds.

DETAILED DESCRIPTION OF THE DISCLOSED EXEMPLARY EMBODIMENTS

Figure 1A:
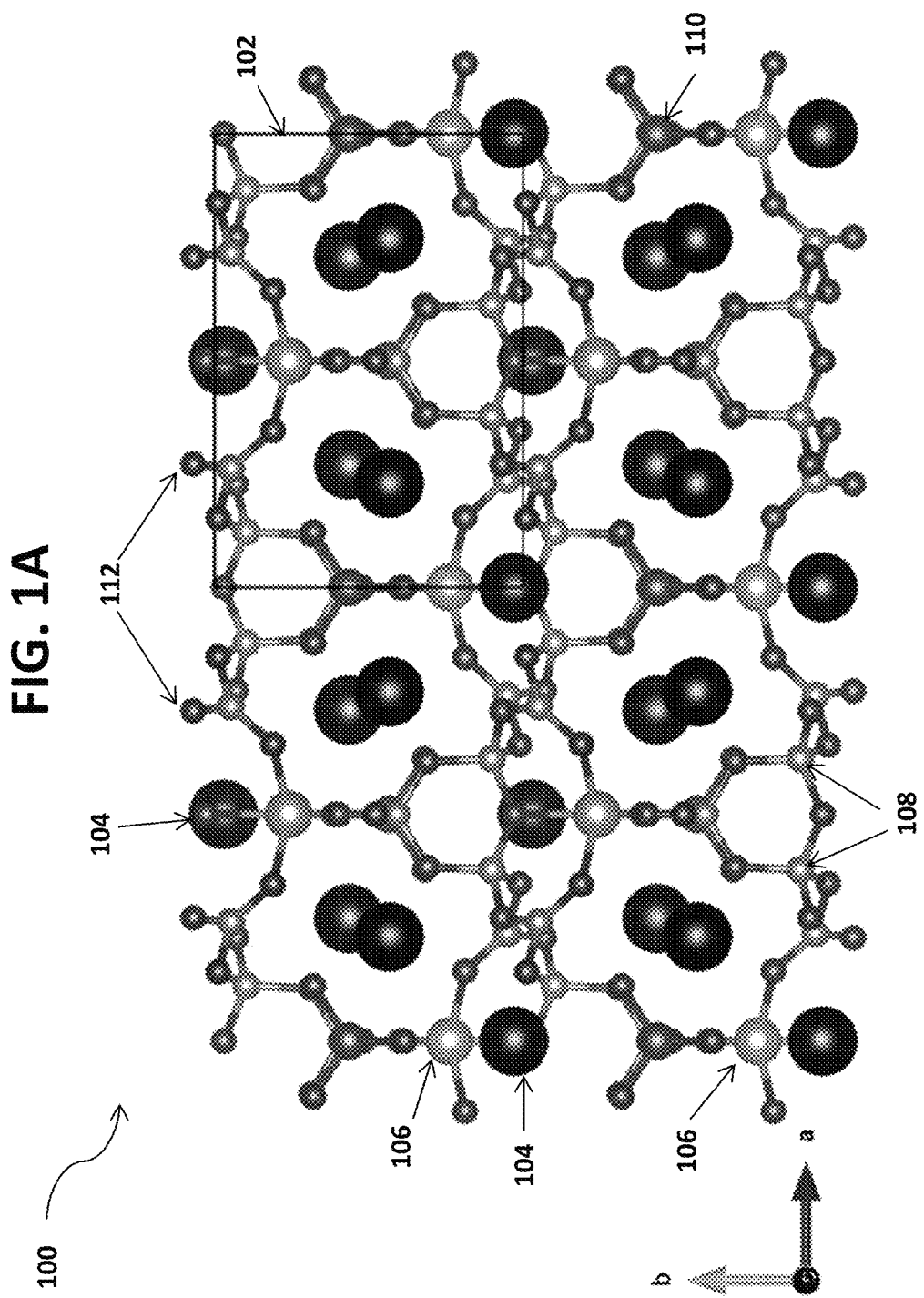
FIG. 1A is a ball-and-stick diagram of molecules of BZBP fabricated according to certain embodiments of the present disclosure.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

Conventional Methods and Materials

Conventionally, there are commercially available materials for lasers that will go from 1064 mn to 532 nm and from 1064 nm to 266 nm. For the latter, materials such as $\beta$-$BaB_2O_4$($\beta$-BBO) and $CsLiB_6O_{10}$ (CLBO) are available and used in commercially available lasers. $\beta$-BBO and CLBO are the NLO crystals conventionally employed for 266 nm lasers. For example, a laser at 177.3 nm would be a sixth harmonic generation (SxHG), or 1064/6=177.3 nm. The solid-state laser that could work at 177.3 nm can be employed in photolithography and other advanced technologies. Conventionally, there has been one material that has been shown to lase at 177.3 nm-$KBe_2BO_3F_2$(KBBF). However, KBBF has both manufacturing and application challenges issues. For example, (1) To synthesize KBBF, BeO must be employed, and BeO is highly toxic and may have restrictions on experimentation and use; (2) Even though KBBF was discovered in the late 1990's, the largest crystal grown to date is 4 mm due to the layered structure of the material; and (3) KBBF was discovered overseas and exports of the material have been constrained or halted because of its technological applications.

The publication "Design and Synthesis of the Beryllium-Free Deep-Ultraviolet Nonlinear Optical Material, $Ba_3$($ZnB_5O_{10}$)$PO_4$," Advanced Materials, October 2015, by Hongwei Yu, Weiguo Zhang, Joshua Young, James M. Rondinelli, and P. Shiv Halasyamani is incorporated by reference in its entirety herein.

Characterization of BZBP Material

The BZBP material fabricated according to certain embodiments of the present disclosure may be employed for NLO applications below 200 nm, for example, at 177.3 nm. The BZBP material may be fabricated as a polycrystalline material or as an at least one single crystal (or a plurality of single crystals). The following attributes may be desirable for deep-UV NLO applications: (i) crystallographic non-centrosymmetric (NCS) structure, (ii) large transparency window, i.e. a wide band gap, (iii) large second-harmonic generating (SHG) coefficient, (iv) moderate birefringence, (v) chemically stable with a large laser damage threshold, and (vi) easy (repeatable, cost-effective) growth of large volume (cm$^3$) single crystals. As such, those properties and characteristics are measured and discussed herein.

Definitions

A "laser damage threshold" is a term used herein to define a peak fluency of laser irradiation at which irreversible changes in a material's structure may occur. This laser damage threshold may be defined as the highest quantity of laser radiation that a material may absorb before there are changes to the material's optical properties. This may also be defined by the ISO standards 21254-1, 2, 3, and 4 definitions as the highest quantity of laser radiation incident upon the optical component for which the extrapolated probability of damage is zero where the quantity of laser radiation may be expressed as power density, linear power density or energy density.

"Anisotropy" is the term used to define properties/characteristics of material that may vary depending upon the direction in which the properties/characteristics are observed/measured.

"Birefringence," which may be referred to as "double refraction," is an optical material property where a light passing through a crystal is split into two unequal wavelengths, which then each pass through the crystal at different respective speeds. Birefringence is exhibited in optically anisotropic crystals.

"Non-centrosymmetric" is a term used to describe the symmetry (or lack thereof) of certain crystal structures. Non-centrosymmetric materials are materials where point groups lack an inversion center, in contrast to centrosymmetric structures and materials which comprise a unit cell (e.g., face-centered-cubic, "fcc") that has a center of symmetry at, for example, (0,0,0). In this example, the inversion centers may be observed at atom sites such as the atom at (0, 0, ½), which would invert to the atom at (0, 0, -½), and the atom at (½,½, 0) inverts to (-½, -½, 0). While an fcc structure comprises an inversion center at every atom, a structure may be characterized as centrosymmetric if it comprises at least one inversion center, and may be characterized as non-centrosymmetric if it does not comprise any inversion centers.

"Band gap" is the characteristic of a material, such as an optical material, that is associated with the minimum energy needed to move an electron from a bound state (valence band) into a free state (conduction band). Varying energy band structures in semiconductors are associated with the electrical (including thermoelectric) properties exhibited by these semiconductors.

Overview

Nonlinear optical (NLO) materials are of intense interest owing to their ability to control and manipulate light for the generation of coherent radiation at a variety of difficult to access wavelengths. They have efficiently expanded the spectral ranges of solid state lasers from ultraviolet (UV) to infrared (IR). Accessing directly the deep-ultraviolet (DUV) region (L<200 nm), however, is especially challenging, yet desirable for a number of advanced optical technologies, including photolithography for microelectronics and attosecond pulse generation for electron dynamic studies in matter. As such, the design and synthesis of a chemically benign Be-free boratephosphate, $Ba_3(ZnB_5O_{10})PO_4$ ("BZBP"), which exhibits a wide transparency range with second-harmonic-generating properties comparable to $KBe_2BO_3F_2$ ("KBBF"), a material currently employed to generate coherent DUV radiation directly using direct second harmonic generation (SHG). BZBP is air stable to 1000° C. and melts congruently, allowing for facile growth of large crystals and making it ideally suited for NLO applications in the DUV.

Synthesis of BZBP

In an embodiment, polycrystalline $Ba_3ZnB_5PO_{14}$ was synthesized by solid-state methods. The stoichiometric amounts of $BaCO_3$ (Fisher Scientific, 99%), ZnO (Assay, 99.0%), $H_3BO_3$ (Alfa Aesar, 99.0%), and $NH_4H_2PO_4$ (Alfa Aesar, 98.0%) were ground thoroughly, packed tightly in a platinum crucible, and heated to 400° C. for 20 h to decompose ammonium dihydrogen phosphate and borates, and then the temperature was raised to 840° C. held for 72 h with several intermittent grindings, the temperature was then reduced to room temperature. In this manner, pure $Ba_3ZnB_5PO_{14}$ can be obtained. As discussed herein, an "intermittent grinding" refers to a process by which the components are removed from the heating vessel, ground, and in some embodiments ground, sifted to remove a predetermined particle size or range, ground again, and re-sifted for a predetermined number of cycles.

There may be one or more intermittent grinding processes during the heat treat process, and the heating time, temperature, number of intermittent grindings, time at temperature (and/or time ramping up/down and range of the ramp up/down) may be collectively referred to as a "recipe," a "program," or a "protocol" interchangeably herein, and may be referred to in portions or segments in order to discuss the method of BZBP as well as the characterization of the fabricated material. In an embodiment, a "portion" of the protocol comprises a single temperature or a temperature range within which the BZBP is held (in the vessel) for a predetermined period of time before being held at a different temperature or temperature range.

In an alternate embodiment, a single crystal of $Ba_3ZnB_5PO_{14}$ was grown by re-crystallizing the pure polycrystalline samples fabricated according to certain embodiments herein. In an embodiment, the $Ba_3ZnB_5PO_{14}$ polycrystalline sample was melted at 940° C. for about 20 h, and then it was cooled down to 700° C. at a rate of 2° C./h. Finally, it was quenched to room temperature. Millimeter size and colorless single crystals of $Ba_3ZnB_5PO_{14}$ were obtained by this process. In an embodiment, the size of the single crystals fabricated e may be from about 0.1 mm to about 1.5 mm in maximum diameter, and may be cube or rectangular-shaped. In an embodiment, the material fabricated is free from, and thus does not comprise, beryllium.

Figure 4:
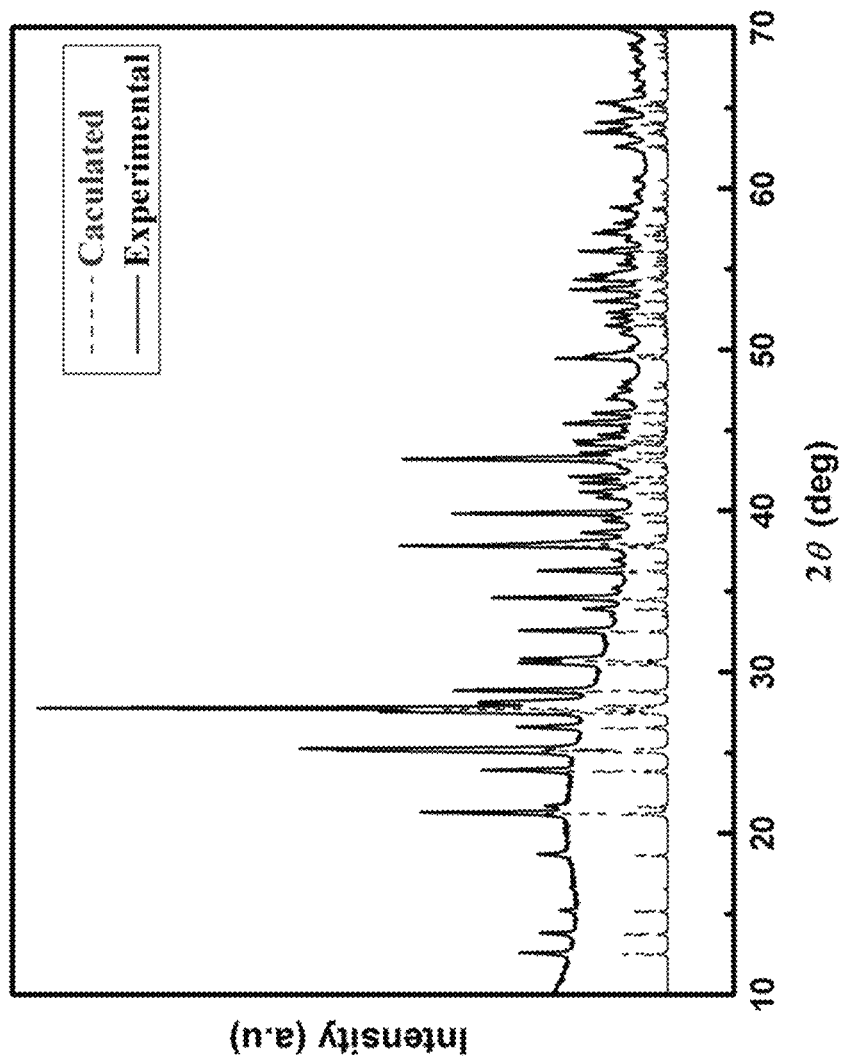
FIG. 4 is a graph of the calculated and experimental results for an x-ray diffraction (XRD) pattern for BZBP fabricated according to certain embodiments of the present disclosure.

In another embodiment, pure and polycrystalline BZBP was synthesized through solid-state techniques as discussed herein by combining stoichiometric amounts of $BaCO_3$, ZnO, $H_3BO_3$, and $NH_4H_2PO_4$ in a Pt crucible and heating the crucible in air. The phase purity was confirmed by powder X-ray diffraction as discussed herein. Single crystals of BZBP were grown by a top-seeded solution growth method. A $H_3BO_3$—ZnO flux system was used for the crystal growth. The mixture was placed in a Pt crucible and melted at 980° C. This temperature was held for 15 h after which a Pt wire was dipped into the clear melt. Small crystals nucleated on the Pt wire and were used as seed crystals that were dipped into the melt as discussed herein in order to seed larger single crystals. Using the seed crystals, BZBP crystals of about 9×7×3 $mm^3$ were grown and indexed (FIG. 4). Layering of the single crystal is not observed in BZBP, which overcomes the layering-growth habit along the c-axis reported for KBBF, and may be attributable to the $ZnB_5O_{10}$ units that are linked in three dimensions (see FIGS. 1B-1D below).

While certain embodiments are discussed herein, the BZBP may be fabricated according to a formula of $A_qB_yC_z$, where A comprises at least one of an alkali metal or an alkaline earth metal, B comprises at least two of boron (B), carbon (C), or a transition metal, and wherein D comprises at least one of oxygen (O), phosphorous (P), and fluorine (F). In an embodiment, q, x, and y are each from about 1 to about 10, and wherein z is from about 1 to about 20. In some embodiments, the material is according to a composition $Ba_3ZnB_5PO_{14}$.

Table 1 provides exemplary data for BZBP material fabricated according to certain embodiments of the present disclosure, which crystallized in the noncentrosymmetric orthorhombic polar space group $Pmn2_1$.

TABLE 1

| Empirical formula | BZBP |
|---|---|
| Temperature | 296 (2) K |
| Wavelength | 0.71073 |
| Formula weight | 786.41 |
| Crystal system | Orthorhombic |
| Space group | $Pmn2_1$ |
| Unit cell dimensions | a = 10.399 (11) Å |
| | b = 7.064 (7) Å |
| | c = 8.204 (8) Å |
| Z | 2 |
| Volume (Å$^3$) | 602.6 (11) |
| Calculated density (Mg/m$^3$) | 4.334 |
| Absorption coefficient (/mm) | 11.851 |
| Reflections collected/unique | 3479/1352 [R(int) = 0.0343] |
| Completeness to theta (27.48°) | 100.0% |
| Goodness-of-fit on F$^2$ | 1.037 |
| Final R indices [I > 2sigma(I)]$^{[a]}$ | R1 = 0.0219, wR2 = 0.0426 |
| Flack factor | −0.01 (3) |
| Extinction coefficient | 0.0067 (3) |
| Largest diff. peak and hole (e · Å$^{-3}$) | 1.089 and −0.857 |

It is noted that [a] is used in Table 1 to indicated that $R_1=\Sigma||F_o|-|F_c||/\Sigma|F_o|$ and $wR_2=[\Sigma w(F_o^2-F_c^2)^2/\Sigma w\ F_o^4]^{1/2}$ for $F_o^2 > 2\sigma(F_o^2)$.

Table 2 illustrates the atomic coordinates (×10$^4$) and equivalent isotropic displacement parameters (Å$^2$×10$^3$) for $Ba_3(ZnB_5O_{10})PO_4$. $U_{eq}$ is defined as one-third of the trace of the orthogonalized $U_{ij}$ tensor. In the asymmetric unit, there are two unique Ba atoms, one unique Zn atom, one unique P atom, three unique B atoms, and nine O atoms. The B atoms exhibit two types of coordination environments—BO 3 triangles and BO 4 tetrahedra. The B—O bond distances range from 1.330(8) to 1.396(9) Å and 1.463(7) to 1.491(7) Å, respectively. The P and Zn atoms are coordinated by four O atoms to form $PO_4$ and $ZnO_4$ tetrahedra. The P—O and Zn—O bond distances range from 1.539(4) to 1.545(6) Å and 1.941(7) to 2.065(6) Å, respectively.

TABLE 2

| Atom | x | y | z | $U_{eq}$ | BVS |
|---|---|---|---|---|---|
| Ba(1) | 2298 (1) | 4348 (1) | 9390 (1) | 12 (1) | 1.95 |
| Ba(2) | 0 | 294 (1) | 7253 (1) | 10 (1) | 2.16 |
| Zn(1) | 5000 | 7603 (2) | 8330 (1) | 10 (1) | 1.89 |
| P(1) | 0 | 5663 (3) | 6611 (3) | 11 (1) | 4.91 |
| B(1) | 2623 (6) | 9471 (9) | 9259 (12) | 8 (1) | 3.00 |
| B(2) | 3775 (6) | 11026 (10) | 6740 (8) | 7 (1) | 2.99 |
| B(3) | 5000 | 4107 (15) | 6609 (13) | 10 (2) | 2.97 |
| O(1) | 1223 (4) | 6799 (6) | 7012 (6) | 13 (1) | 1.99 |
| O(2) | 5000 | 10294 (8) | 7349 (10) | 9 (1) | 1.94 |
| O(3) | 1163 (4) | 6879 (6) | 11578 (5) | 10 (1) | 2.09 |
| O(4) | 0 | 3867 (10) | 7687 (7) | 15 (2) | 2.21 |
| O(5) | 5000 | 5984 (9) | 6418 (8) | 9 (1) | 1.99 |
| O(6) | 0 | 5202 (9) | 4776 (7) | 15 (1) | 1.87 |
| O(7) | 3455 (4) | 8111 (6) | 9640 (5) | 15 (1) | 1.97 |
| O(8) | 2720 (4) | 693 (6) | 7938 (5) | 9 (1) | 2.07 |
| O(9) | 1525 (4) | −116 (6) | 10170 (5) | 11 (1) | 1.89 |

Table 3 illustrates the selected bond distances (Å) and angles (deg) for $Ba_3(ZnB_5O_{10})PO_4$. The P and Zn atoms are coordinated by four O atoms to form $PO_4$ and $ZnO_4$ tetrahedra. The P—O and Zn—O bond distances range from 1.539(4) to 1.545(6) Å and 1.941(7) to 2.065(6) Å, respectively. The Ba atoms are coordinated by nine O atoms with Ba—O bond lengths ranging from 2.549(7) to 2.938(5) Å. These bond lengths are consistent with those known for oxides containing Ba, including known borophosphates.

TABLE 3

| | | | |
|---|---|---|---|
| Ba(1)-O(1)#1 | 2.766 (5) | O(1)#1-Ba(1)-O(9) | 72.92 (12) |
| Ba(1)-O(4) | 2.788 (4) | O(4)-Ba(1)-O(9) | 76.91 (15) |
| Ba(1)-O(3) | 2.795 (5) | O(3)-Ba(1)-O(9) | 112.47 (13) |
| Ba(1)-O(1) | 2.838 (5) | O(1)-Ba(1)-O(9) | 128.13 (13) |
| Ba(1)-O(6)#1 | 2.846 (3) | O(6)#1-Ba(1)-O(9) | 108.92 (14) |
| Ba(1)-O(8) | 2.877 (5) | O(8)-Ba(1)-O(9) | 42.59 (12) |
| Ba(1)-O(5)#1 | 2.921 (4) | O(5)#1-Ba(1)-O(9) | 67.39 (15) |
| Ba(1)-O(7) | 2.925 (5) | O(7)-Ba(1)-O(9) | 161.84 (11) |
| Ba(1)-O(3)#2 | 2.938 (5) | O(3)#2-Ba(1)-O(9) | 90.18 (12) |
| Ba(2)-O(4) | 2.549 (7) | O(4)-Ba(2)-O(1)#4 | 152.63 (9) |
| Ba(2)-O(1)#3 | 2.784 (5) | O(1)#3-Ba(2)-O(1)#4 | 54.34 (18) |
| Ba(2)-O(1)#4 | 2.784 (5) | O(4)-Ba(2)-O(9) | 89.07 (14) |
| Ba(2)-O(9) | 2.885 (5) | O(1)#3-Ba(2)-O(9) | 102.75 (14) |
| Ba(2)-O(9)#5 | 2.885 (5) | O(1)#4-Ba(2)-O(9) | 73.67 (13) |
| Ba(2)-O(8)#5 | 2.897 (5) | O(4)-Ba(2)-O(9)#5 | 89.07 (14) |
| Ba(2)-O(8) | 2.897 (5) | O(1)#3-Ba(2)-O(9)#5 | 73.67 (14) |
| Ba(2)-O(7)#6 | 2.906 (5) | O(1)#4-Ba(2)-O(9)#5 | 102.75 (14) |
| Ba(2)-O(7)#2 | 2.906 (5) | O(9)-Ba(2)-O(9)#5 | 66.66 (17) |
| Zn(1)-O(5) | 1.941 (7) | O(4)-Ba(2)-O(8)#5 | 82.91 (8) |
| Zn(1)-O(7) | 1.966 (4) | O(1)#3-Ba(2)-O(8)#5 | 69.78 (13) |
| Zn(1)-O(7)#7 | 1.966 (4) | O(1)#4-Ba(2)-O(8)#5 | 123.08 (12) |
| Zn(1)-O(2) | 2.065 (6) | O(9)-Ba(2)-O(8)#5 | 112.67 (13) |
| P(1)-O(6) | 1.540 (6) | O(9)#5-Ba(2)-O(8)#5 | 46.57 (12) |
| P(1)-O(1)#5 | 1.539 (4) | O(4)-Ba(2)-O(8) | 82.91 (8) |
| P(1)-O(1) | 1.539 (4) | O(1)#3-Ba(2)-O(8) | 123.08 (12) |
| P(1)-O(4) | 1.545 (6) | O(1)#4-Ba(2)-O(8) | 69.78 (13) |
| B(1)-O(7) | 1.330 (8) | O(9)-Ba(2)-O(8) | 46.57 (12) |
| B(1)-O(8)#8 | 1.390 (9) | O(9)#5-Ba(2)-O(8) | 112.67 (13) |
| B(1)-O(9)#8 | 1.396 (9) | O(8)#5-Ba(2)-O(8) | 154.94 (17) |
| B(2)-O(2) | 1.463 (7) | O(4)-Ba(2)-O(7)#6 | 73.67 (14) |
| B(2)-O(9)#2 | 1.473 (8) | O(1)#3-Ba(2)-O(7)#6 | 92.24 (14) |
| B(2)-O(3)#9 | 1.487 (8) | O(1)#4-Ba(2)-O(7)#6 | 122.96 (14) |
| B(2)-O(8)#8 | 1.491 (7) | O(9)-Ba(2)-O(7)#6 | 162.65 (13) |
| B(3)-O(5) | 1.335 (12) | O(9)#5-Ba(2)-O(7)#6 | 110.30 (14) |
| B(3)-O(3)#2 | 1.396 (7) | O(8)#5-Ba(2)-O(7)#6 | 64.25 (13) |
| B(3)-O(3)#10 | 1.396 (7) | O(8)-Ba(2)-O(7)#6 | 130.17 (12) |
| O(1)#1-Ba(1)-O(4) | 146.18 (15) | O(4)-Ba(2)-O(7)#2 | 73.67 (14) |
| O(1)#1-Ba(1)-O(3) | 85.56 (14) | O(1)#3-Ba(2)-O(7)#2 | 122.96 (14) |
| O(4)-Ba(1)-O(3) | 92.19 (17) | O(1)#4-Ba(2)-O(7)#2 | 92.24 (14) |
| O(1)#1-Ba(1)-O(1) | 158.80 (6) | O(9)-Ba(2)-O(7)#2 | 110.30 (14) |
| O(4)-Ba(1)-O(1) | 52.58 (16) | O(9)#5-Ba(2)-O(7)#2 | 162.65 (13) |
| O(3)-Ba(1)-O(1) | 83.39 (13) | O(8)#5-Ba(2)-O(7)#2 | 130.17 (12) |
| O(1)#1-Ba(1)-O(6)#1 | 52.90 (15) | O(8)-Ba(2)-O(7)#2 | 64.25 (13) |
| O(4)-Ba(1)-O(6)#1 | 156.27 (16) | O(7)#6-Ba(2)-O(7)#2 | 67.13 (18) |
| O(3)-Ba(1)-O(6)#1 | 105.87 (15) | O(5)-Zn(1)-O(7) | 123.31 (14) |
| O(1)-Ba(1)-O(6)#1 | 113.40 (15) | O(5)-Zn(1)-O(7)#7 | 123.31 (14) |
| O(1)#1-Ba(1)-O(8) | 88.54 (13) | O(7)-Zn(1)-O(7)#7 | 109.6 (3) |
| O(4)-Ba(1)-O(8) | 79.29 (16) | O(5)-Zn(1)-O(2) | 103.1 (3) |
| O(3)-Ba(1)-O(8) | 154.77 (12) | O(7)-Zn(1)-O(2) | 92.59 (18) |
| O(1)-Ba(1)-O(8) | 108.84 (14) | O(7)#7-Zn(1)-O(2) | 92.59 (18) |
| O(6)#1-Ba(1)-O(8) | 89.76 (15) | O(5)-Zn(1)-O(6)#1 | 84.8 (2) |
| O(1)#1-Ba(1)-O(5)#1 | 89.35 (15) | O(7)-Zn(1)-O(6)#1 | 82.86 (15) |
| O(4)-Ba(1)-O(5)#1 | 64.84 (16) | O(7)#7-Zn(1)-O(6)#1 | 82.86 (15) |
| O(3)-Ba(1)-O(5)#1 | 48.73 (16) | O(2)-Zn(1)-O(6)#1 | 172.0 (3) |
| O(1)-Ba(1)-O(5)#1 | 96.80 (15) | O(6)-P(1)-O(1)#5 | 108.6 (2) |
| O(6)#1-Ba(1)-(5)#1 | 138.87 (16) | O(6)-P(1)-O(1) | 108.6 (2) |
| O(8)-Ba(1)-O(5)#1 | 106.78 (15) | O(1)#5-P(1)-O(1) | 111.4 (4) |
| O(1)#1-Ba(1)-O(7) | 89.00 (14) | O(6)-P(1)-O(4) | 112.6 (4) |
| O(4)-Ba(1)-O(7) | 119.88 (16) | O(1)#5-P(1)-O(4) | 107.8 (2) |
| O(3)-Ba(1)-O(7) | 63.06 (13) | O(1)-P(1)-O(4) | 107.8 (2) |
| O(1)-Ba(1)-O(7) | 69.86 (14) | O(7)-B(1)-O(8)#8 | 125.8 (6) |
| O(6)#1-Ba(1)-O(7) | 58.95 (15) | O(7)-B(1)-O(9)#8 | 123.9 (7) |
| O(8)-Ba(1)-O(7) | 141.42 (12) | O(8)#8-B(1)-O(9)#8 | 110.3 (5) |
| O(5)#1-Ba(1)-O(7) | 111.68 (15) | O(2)-B(2)-O(9)#2 | 109.2 (5) |
| O(1)#1-Ba(1)-O(3)#2 | 102.78 (12) | O(2)-B(2)-O(3)#9 | 110.1 (5) |
| O(4)-Ba(1)-O(3)#2 | 92.14 (16) | O(9)#2-B(2)-O(3)#9 | 111.4 (5) |
| O(3)-Ba(1)-O(3)#2 | 157.33 (7) | O(2)-B(2)-O(8)#8 | 111.1 (5) |
| O(1)-Ba(1)-O(3)#2 | 81.65 (14) | O(9)#2-B(2)-O(8)#8 | 110.6 (5) |
| O(6)#1-Ba(1)-O(3)#2 | 65.33 (15) | O(3)#9-B(2)-O(8)#8 | 104.4 (5) |
| O(8)-Ba(1)-O(3)#2 | 47.71 (11) | O(5)-B(3)-O(3)#2 | 119.6 (4) |
| O(5)#1-Ba(1)-O(3)#2 | 150.35 (15) | O(5)-B(3)-O(3)#10 | 119.6 (4) |
| O(7)-Ba(1)-O(3)#2 | 95.69 (12) | O(3)#2-B(3)-O(3)#10 | 120.1 (9) |

The symmetry transformations used to generate equivalent atoms in Table 3 are indicated below:

1 −x+½,−y+1,z+½
2 −x+½,−y+1,z−½
3 −x,y−1,z
4 x,y−1,z
5 −x,y,z
6 x−½,−y+1,z−½
7 −x+1,y,z
8 x,y+,z

9 −x+½,−y+2,z−½
10 x+½,−y+1,z−½
11 −x+½,−y+2,z+½

Discussion of Fabrication, Characterization, and Application of BZBP

Referring to FIG. 1A, a plurality of molecules are shown for the BZBP material fabricated according to certain embodiments of the present disclosure. In particular in FIG. 1A, the arrangement of molecules of BZBP 100 is illustrated, as is a single molecule 102 of BZBP, the rectangular outline indicates the single molecule 102. In FIG. 1A, 104 indicates the barium (Ba) molecules, 106 indicates the zinc (Zn) molecules, 108 indicates the boron (B) molecules, 110 indicates the phosphorous (P) molecules, and 112 indicates the oxygen (O) molecules.

Figure 1B:
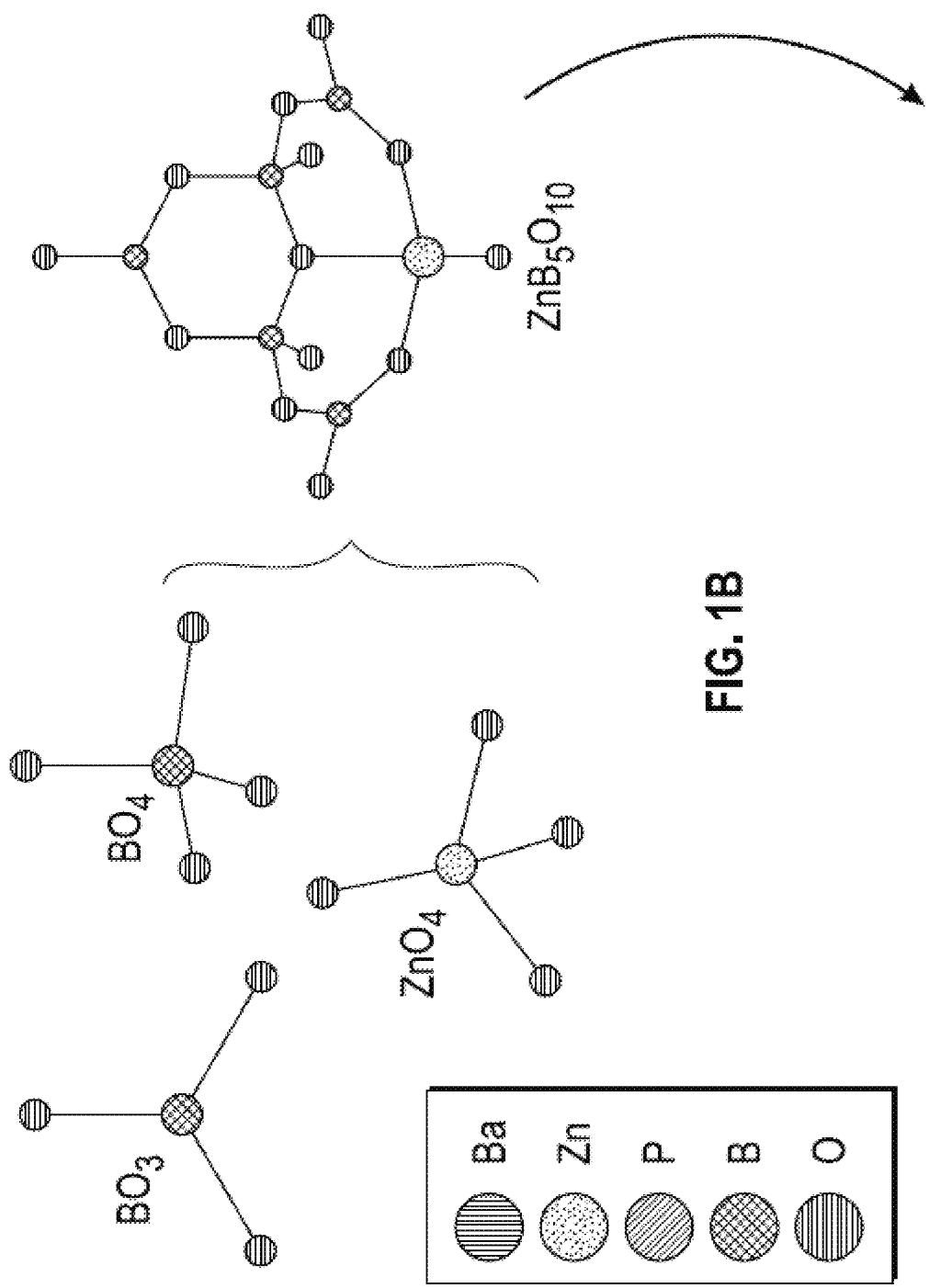

In an embodiment, as shown in FIG. 1B, the basic building unit of BZBP is a three six-membered ring [$ZnB_5O_{10}$] group composed of three [$BO_3$] triangles, two [$BO_4$] tetrahedra, and one [$ZnO_4$] tetrahedron that are cornershared through oxygen atoms. The arrow in FIG. 1B indicates the relationship of FIG. 1B to FIG. 1C in that FIG. 1C illustrates a [$ZnB_5O_{10}$] ∞ framework. As shown in FIG. 1C, the adjacent [$ZnB_5O_{10}$] building units share corners to create a [$ZnB_5O_{10}$]∞ framework (FIG. 1C). The Ba atoms and the isolated $PO_4$ tetrahedra fill the spaces of the [$ZnB_5O_{10}$] ∞ framework (FIG. 1D). As such, these crystal structures confirm that BZBP is a zincoborate-phosphate.

FIGS. 2A-2D illustrate the second harmonic image generation (SHG) results with respect to particle size for BZBP fabricated according to certain embodiments of the present disclosure in comparison to other optical materials. Turning to FIGS. 2A and 2B, the second harmonic image generation (SHG) results with respect to particle size are illustrated for BBO (the conventional material) and BZBP (the material fabricated herein). SHG may also be referred to as "frequency doubling" and is the term used to refer to a nonlinear optical process where new photons are generated when photons with the same frequency interact with a nonlinear material, and the new photons generated have twice the energy of the parent photons (and consequently half the wavelength and twice the frequency). The SHG phenomenon is only found in non-centrosymmetric materials, such as the BZBP discussed herein.

FIG. 2A illustrates the SHG data at a wavelength of 532 nm and FIG. 2B illustrates the SHG data at a wavelength of 1064 nm. Both FIGS. 2A and 2B confirm that the BZBP material exhibits active SHG behavior at least at the wavelengths of 532 nm and 1064 nm. For example, in FIG. 2A at 532 nm, the BZBP material exhibits an SHG coefficient from about 20 a.u. to about 30 a.u. between a particle size of about 35 μm to about 130 μm. This "particle size" refers to the final particle size after any grinding prior to heat treat as well as any grinding done during the heating process. This is in comparison to the BBO results which were from about 68 a.u. to about 80 a.u. over about the same particle size range.

FIG. 2B shows that, at 1064 nm, the BZBP material exhibits an SHG coefficient from about 35 a.u. to about 70 a.u. between a particle size of about 35 m to about 120 m, as compared to the BBO material over the same particle size range which exhibited a range from about 130 a.u. to about 135 a.u.

FIG. 2C illustrates particle size v. SHG for BZBP fabricated according to certain embodiments of the present disclosure as compared to Potassium Dihydrogen Phosphate (KDP). FIG. 2D illustrates particle size v. SHG for BZBP fabricated according to certain embodiments of the present disclosure as compared to β-BBO. The frequency doubling capabilities of polar BZBP. The SHG efficiencies as a function of particle size, as shown in FIGS. 2C and 2D, indicate that BZBP has SHG efficiencies of approximately 4×KDP and 0.5×β-BBO at 532 and 266 nm, respectively, in the 45-63 m particle range. Furthermore, BZBP is type-1 phase-matchable at both wavelengths.

Figure 3:
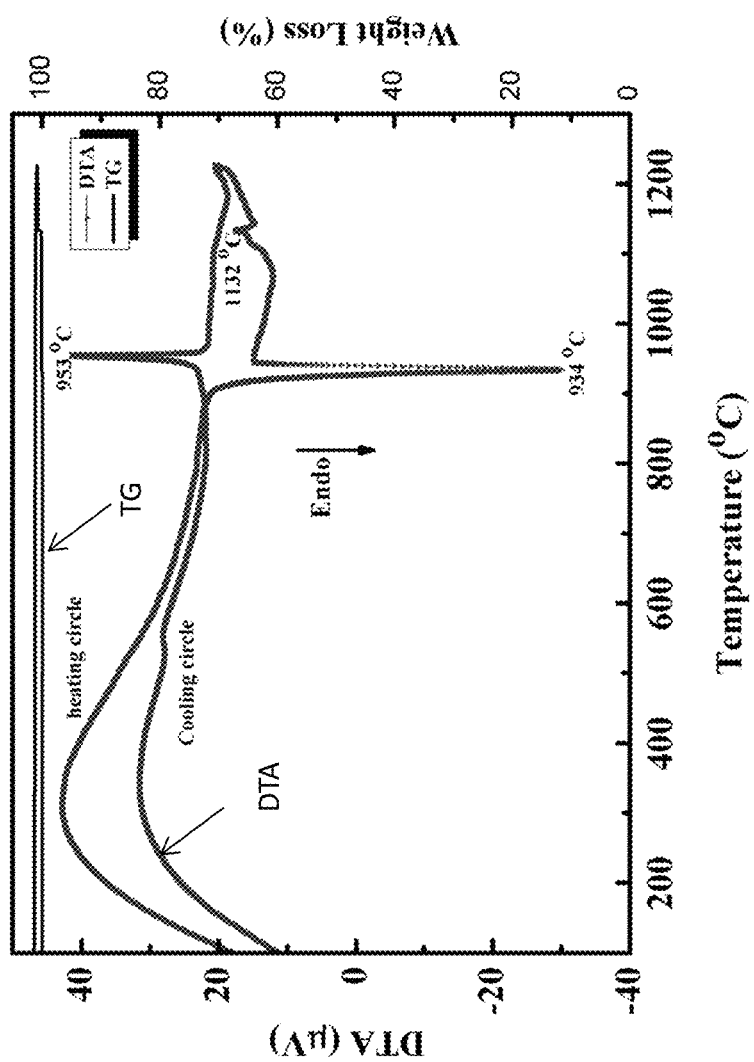
FIG. 3 is a graph of the differential thermal analysis (DTA) results of samples of BZBP fabricated according to certain embodiments of the present disclosure.

Referring now to FIG. 3, the differential thermal analysis (DTA) of samples of BZBP fabricated according to certain embodiments of the present disclosure illustrates the reaction of the BZBP material from about 200° C. to about 1200° C. In particular, FIG. 3 illustrates the behavior of the material through a heating cycle and a cooling cycle, as indicated. Temperature stability was observed above about 900° C., and the TG data illustrates that there was virtually no weight loss as a result of the increasing temperature. There is only one endothermic (exothermic) peak on the heating (cooling) curve at 937° C. (827° C.), indicating BZBP melts congruently. In addition, in this embodiment, there was no weight loss observed up to 1000° C.

Referring now to FIG. 4, an XRD pattern was calculated for the pure-phase of BZBP, and compared to the results of the XRD pattern for samples of BZBP fabricated according to certain embodiments of the present disclosure. The calculated and experimental x-ray diffraction patterns match, which indicates that the samples fabricated are pure materials.

Figure 5:
FIG. 5 is a photograph of BZBP fabricated according to certain embodiments of the present disclosure.

FIG. 5 is a photograph of BZBP fabricated according to certain embodiments of the present disclosure. FIG. 5 illustrates that the largest outer diameter of these crystals may be less than 2 mm.

Figure 6:
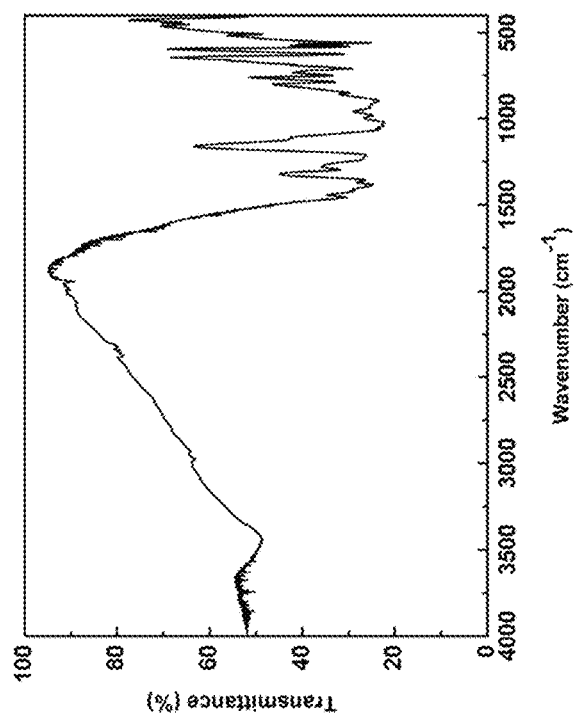
FIG. 6 illustrates an infrared (IR) spectrum of NLO materials fabricated according to certain embodiments of the present disclosure.

FIG. 6 illustrates an infrared (IR) spectrum of NLO materials fabricated according to certain embodiments of the present disclosure. The IR spectrum was recorded with a Bruker Tensor 37 FTIR spectrometer in the 400-4000 $cm^{-1}$ wave number range using KBr pellets (Figure S3). The main IR absorption region between 1458 and 507 $cm^{-1}$ reveals several absorption bands on account of stretching and bending vibrations of the B—O and P—O groups, which are similar to those of other borate-phosphates.

Figure 7:
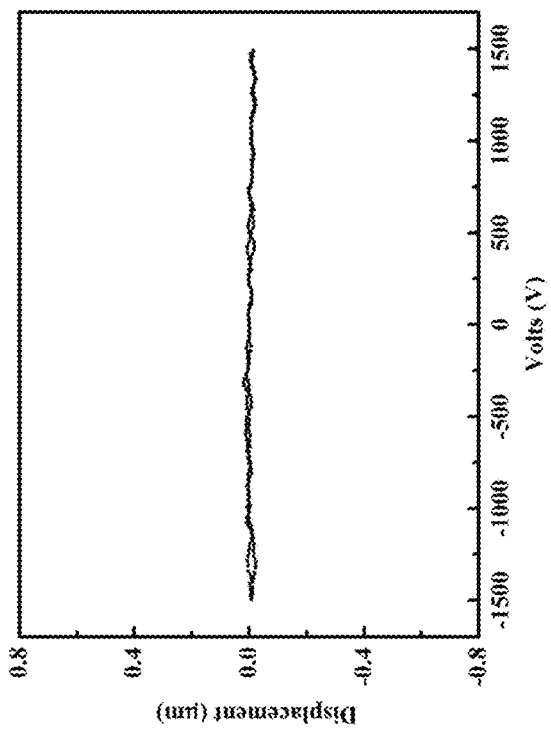
FIG. 7 illustrates the piezoelectric measurement data for samples of BZBP fabricated according to certain embodiments of the present disclosure.

FIG. 7 illustrates the piezoelectric measurement data for samples of BZBP fabricated according to certain embodiments of the present disclosure.

Figure 8:
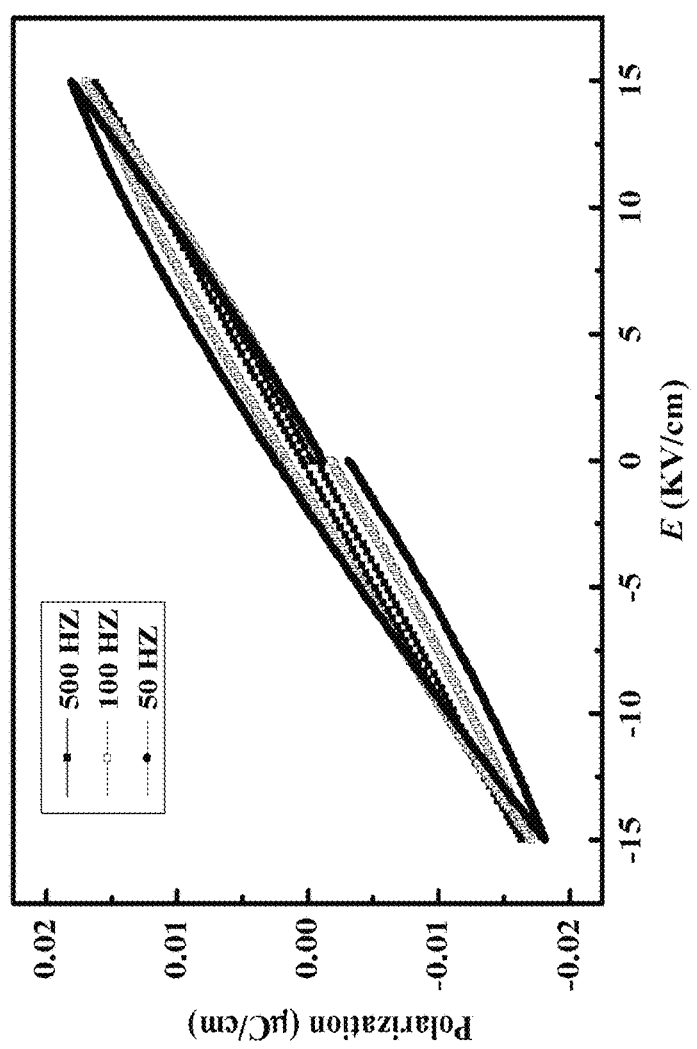
FIG. 8 illustrates polarization measurements for samples of BZBP fabricated according to certain embodiments of the present disclosure.

FIG. 8 illustrates polarization measurements for samples of BZBP fabricated according to certain embodiments of the present disclosure. The BZBP sample was pressed into pellets (~12 mm diameter, ~1 mm thickness) and sintered at 850° C. for 10 h. Silver paste was applied to both sides as electrodes. The polarization was measured on a Radiant Technologies RT66A Ferroelectric Test system with a TREK high voltage amplifier between 30 and 230° C. in 10° C. increments with a 15 kV/cm electric field at 500 Hz. To determine any ferroelectric behavior, the polarization loop was measured at room temperature under a 15 kV/cm static electric field with the frequency ranging from 50 to 500 Hz. As shown in FIG. 8, the polarization versus electric field plots at 15 kV/cm electric field vary with the different frequencies. Note that there is no hysteresis, indicating that the material is not ferroelectric; that is, the polarization is not reversible.

Figure 9:
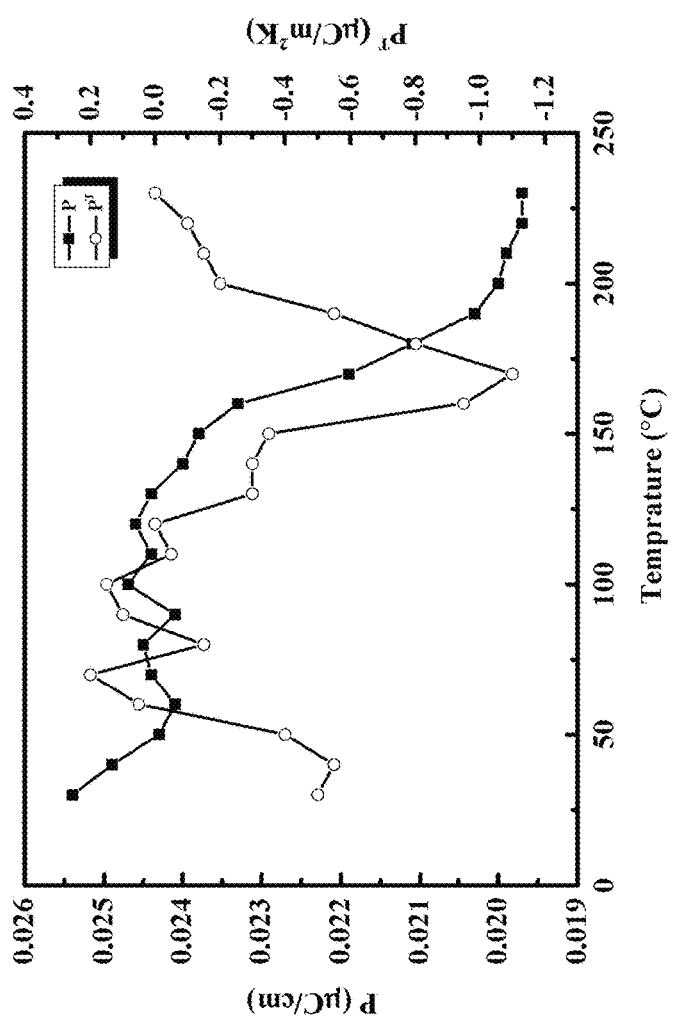
FIG. 9 illustrates a plot of temperature v. pyroelectric coefficient ($P^T$) and a plot of temperature v. maximum polarization (P) of BZBP fabricated according to certain embodiments of the present disclosure.

FIG. 9 illustrates a plot of temperature v. pyroelectric coefficient ($P^T$) and a plot of temperature v. maximum polarization (P) of BZBP fabricated according to certain embodiments of the present disclosure.

Figure 10B:
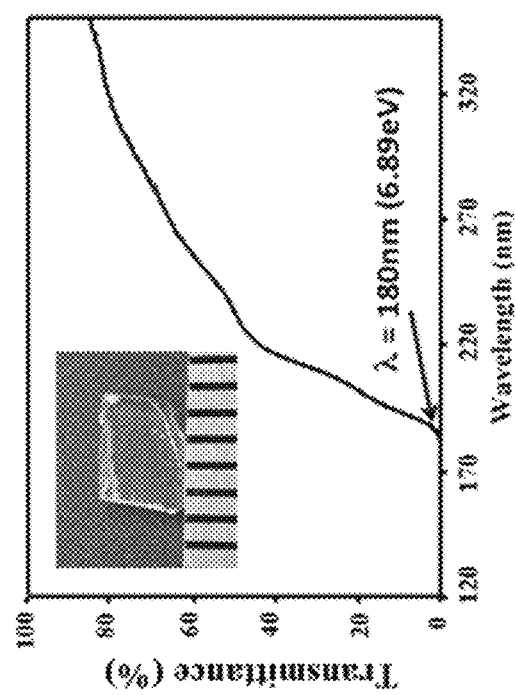
FIGS. 10A and 10B illustrate reflectance and absorption of samples of BZBP fabricated according to certain embodiments of the present disclosure.
Figure 10A:
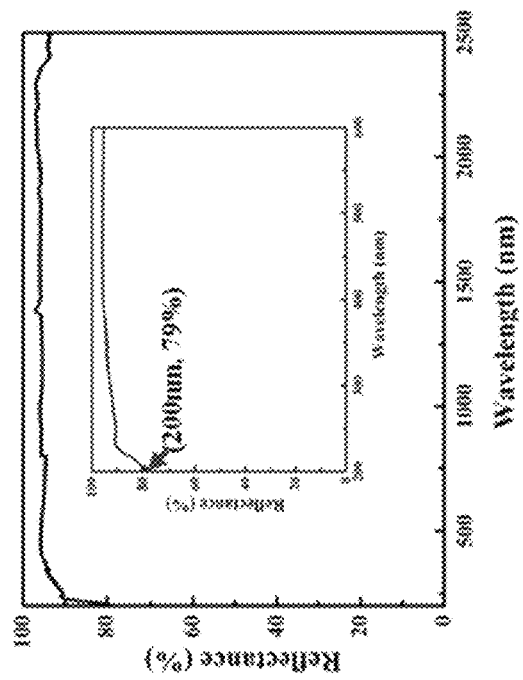

FIG. 10A shows the UV-vis-IR diffuse-reflectance spectrum for polycrystalline BZBP. Polycrystalline BZBP has a large transmission, >90%, from 230 to 2500 nm, with a short UV cutoff edge below 200 nm as determined from the UV-vis-IR diffuse-reflectance spectrum. The reflectance at 200 nm is nearly 80%, indicating BZBP is transparent well below 200 nm. In order to investigate the DUV absorption, additional measurements were performed on a single crystal of BZBP on a McPherson VUVas2000 spectrophotometer from 120 to 350 nm and are illustrated in FIG. 10B. FIG. 10B indicates that the absorption edge is 180 nm, confirming that the optical transparency of BZBP is advantageous for frequency generation in the DUV. The inset in FIG. 10B shows a single crystal with a thickness of about 1 mm that was cut from a crystal of BZBP fabricated according to certain embodiments of the present disclosure.

Figure 11A:
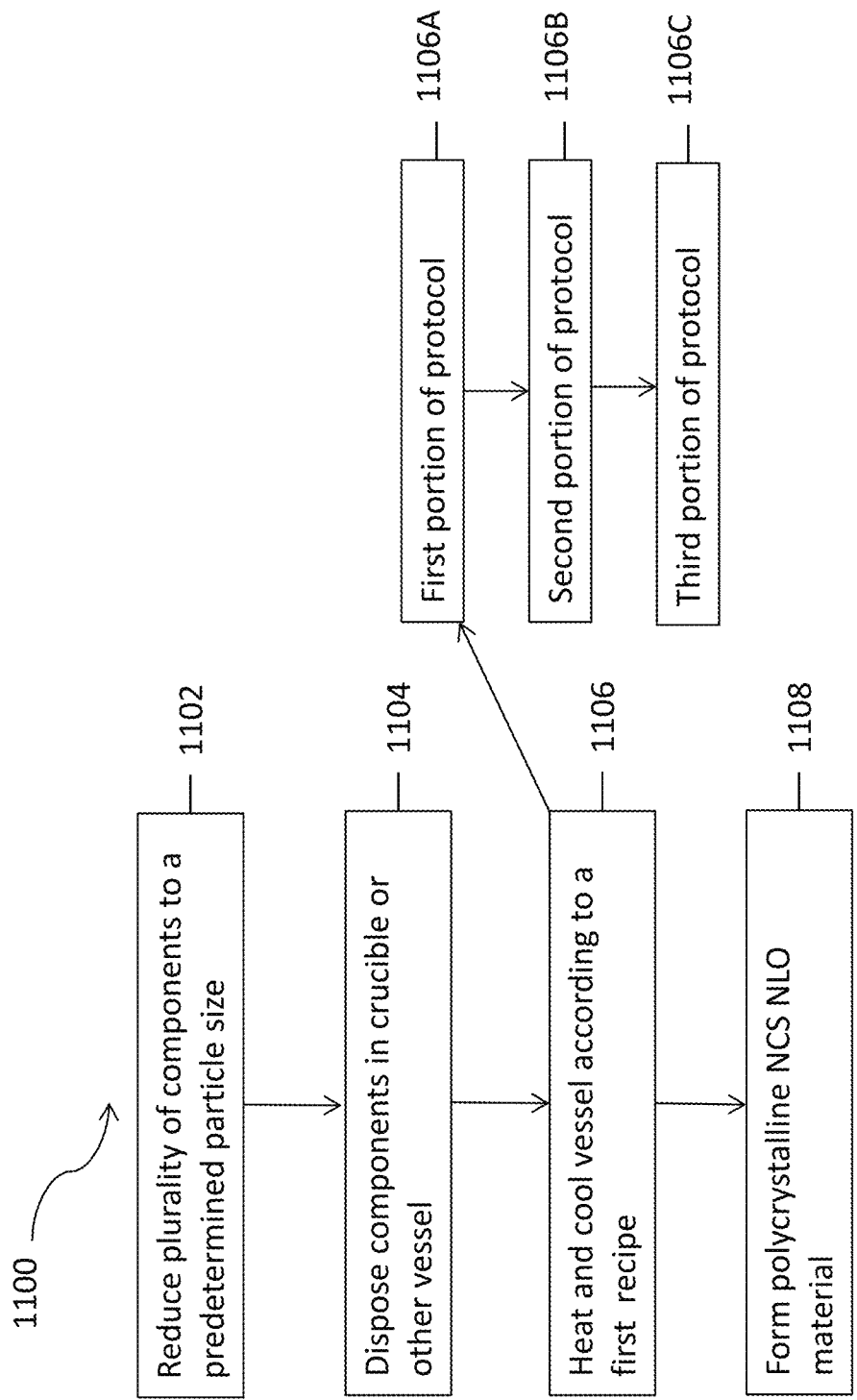
FIGS. 11A and 11B illustrate flow diagrams of methods of fabricating samples of polycrystalline and single crystal BZBP according to certain embodiments of the present disclosure.

Turning to FIG. 11A, a method 1100 may be used to fabricate polycrystalline BZBP. At block 1102 of the method 1100, stoichiometric amounts of a plurality of components are ground to a predetermined mean particle size or range of particle sizes. In an embodiment, the plurality of components comprises $BaCO_3$, $ZnO$, $H_3BO_3$, and $NH_4H_2PO_4$ were ground thoroughly at block 1102 and packed tightly in a vessel such as a platinum crucible at block 1104. At block 1106, the packed ground material may be heated one or more times and may be held at different temperatures for varying predetermined periods of time. Heating the material and then holding the heated material at a temperature is described herein as a cycle. One or more such cycles, when performed in a sequence, may be part of a protocol. In an embodiment, the vessel (and therefore the components in the vessel) may be heated according to a protocol at block 1106 that may comprise a first portion 1106A, a second portion 1106B, and a third portion 1106C. In different embodiments, the protocol executed at block 1106 may comprise greater or fewer portions, which may comprise various degrees and times of heating as well as various quench programs. In an embodiment, during the first portion 1106A, the vessel is heated from a first temperature to a second during a first duration of time, during which the particle size of the components may be further reduced during at least one grinding cycle. In a subsequent second portion 1106B, the vessel is heated from a third temperature to a fourth during a second duration of time, during which the particle size of the components may be further reduced during at least one grinding cycle. At least one of the third or fourth temperatures in the second portion 1106B may be greater than the second temperature in the first portion 1106B. In some embodiments, the second duration of time at block 1106B may be longer than the first duration of time in block 1106A. In an embodiment, at block 1106C, a quench may occur.

In an embodiment, the vessel may be heated at block 1106 using a protocol comprising holding the ground components in a first portion 1106A at about 400° C. during a first protocol portion for about 20 h to decompose ammonium dihydrogen phosphate and borates. In this example protocol, the temperature was raised to 840° C. and held for 72 h during a second protocol portion at block 1106B. In some embodiments, the components may be further ground one or more times at block 1106A and/or 1106B during one, some, or all portions of the protocol. In the example protocol, the temperature was reduced to room temperature after the second portion at 840° C. At block 1108, subsequent to cooling, the pure, polycrystalline $Ba_3ZnB_5PO_{14}$ was obtained.

Figure 11B:
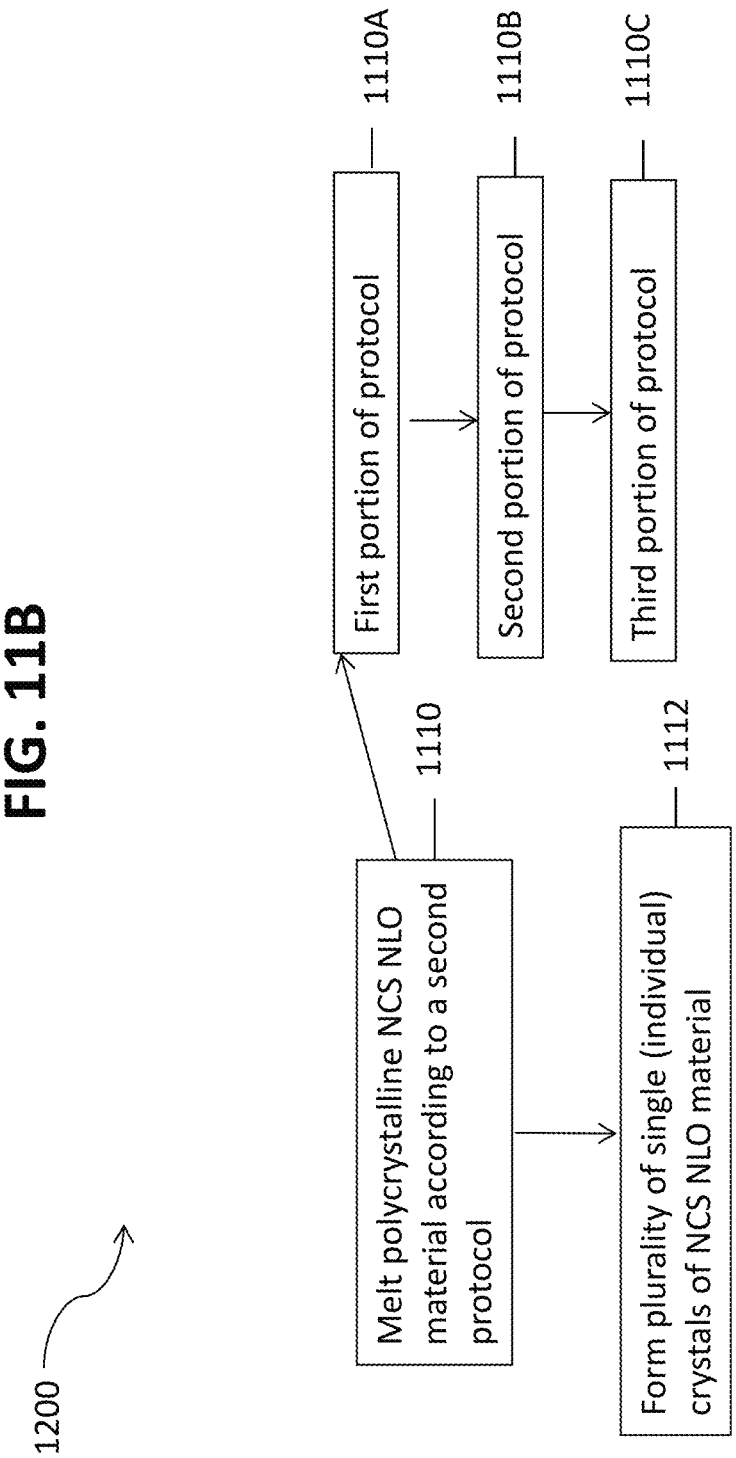

FIG. 11B illustrates an alternate method embodiment 1200 which may start at block 1108 in FIG. 11A. At block 1108 in FIG. 11A, the polycrystalline $Ba_3ZnB_5PO_{14}$ was fabricated. In the method 1200, a single crystal of $Ba_3ZnB_5PO_{14}$ was grown by re-crystallizing the pure polycrystalline samples. That is, at block 1110, the $Ba_3ZnB_5PO_{14}$ polycrystalline sample was melted using a protocol comprising at least two portions. In an embodiment, the vessel (and therefore the components in the vessel) may be heated according to a protocol at block 1110 that may comprise a first portion 1110A, a second portion 1110B, and a third portion 1110C. In different embodiments, the protocol executed at block 1110 may comprise greater or fewer portions, which may comprise various degrees and times of heating as well as various quench programs. In an embodiment, during the first portion 1110A, the vessel is heated from a first temperature to a second during a first duration of time, during which the particle size of the components may be further reduced during at least one grinding cycle. In a subsequent second portion 1110B, the vessel is heated from a third temperature to a fourth during a second duration of time, during which the particle size of the components may be further reduced during at least one grinding cycle. At least one of the third or fourth temperatures in the second portion 1110B may be less than the second temperature in the first portion 1110B. In some embodiments, the second duration of time at block 1110B may be longer than the first duration of time in block 1110A. In an embodiment, at block 1110C, a quench may occur and a plurality of single crystal may be formed at block 1112.

In one example, the polycrystalline BZBP is held during a first portion of a protocol at block 1110A at about 940° C. for about 20 h, and then it was cooled down during a second portion of the protocol to about 700° C. at a rate of 2° C./h at block 1110B. Finally, in a third portion of the protocol at block 1110C, the polycrystalline BZBP was quenched to room temperature. At block 1112, subsequent to quenching, millimeter size, pure, and colorless crystals of $Ba_3ZnB_5PO_{14}$ were obtained. In various embodiments, these single crystals may range in maximum diameter from 0.5 mm to about 10 mm, and may be used to seed the growth of additional single crystals using a top-seeded-solution growth method.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed is:

1. A method of fabricating a polycrystalline non-linear optical (NLO) material, the method comprising:
heating a vessel containing a plurality of components according to a protocol, wherein the protocol comprises at least two heating portions;
forming, subsequent to completing the protocol, a polycrystalline NLO material comprising a crystallographic non-centrosymmetric (NCS) structure having a second harmonic generation (SHG) coefficient at 1064 nm of from about 42 a.u. to about 110 a.u.,
wherein the plurality of components are according to a formula of $Ba_3ZnB_5PO_{14}$.

2. The method of claim 1 further comprising grinding the plurality of components prior to heating the vessel or during the protocol, wherein a particle size of the NLO material is from 30 µm to about 130 µm.

3. The method of claim 1, wherein a first portion of the protocol comprises heating the vessel from a first temperature to a second temperature for a first period of time, and a second portion of the protocol comprises heating the vessel from a third temperature to a fourth temperature for a second period time, wherein the third temperature is higher than the second temperature, and wherein the second period of time is greater than the first.

4. The method of claim 3 further comprising grinding, during the second portion, the plurality of components, wherein grinding the plurality of components comprises further reducing the particle size of at least some of the plurality of components at least once during the second portion of the protocol.

5. The method of claim 3 further comprising reducing the temperature of the vessel to about room temperature.

6. The method of claim 1, wherein a first portion of the protocol comprises heating the vessel from 200° C. to 600° C. for from 15 hours to 20 hours.

7. The method of claim 6, wherein a second portion of the protocol comprises heating the vessel from 700° C. to 1000° C. for from 48 hours to 96 hours.

8. The method of claim 1, wherein a first portion of the protocol comprises holding the vessel from 800° C. to 1100° C. for from 15 hours to 25 hours.

9. The method of claim 8, wherein a second portion of the protocol comprises cooling the vessel to below 700° C. at a rate from 0.5° C. to 3° C./h.

10. The method of claim 9, wherein a third portion of the protocol comprises quenching the vessel to about room temperature.

11. The method of claim 1 further comprising grinding, during a first portion of the protocol, the plurality of components, wherein grinding the plurality of components comprises further reducing a particle size of at least some of the plurality of components at least once during the first portion of the protocol.

12. The method of claim 1, wherein the polycrystalline NLO material comprises a pure-phase material.

13. A method of fabricating a polycrystalline non-linear optical (NLO) material, the method comprising:
heating a vessel containing a plurality of components according to a protocol, wherein the protocol comprises at least two heating portions;
forming, subsequent to completing the protocol, a polycrystalline NLO material comprising a crystallographic non-centrosymmetric (NCS) structure having a second harmonic generation (SHG) coefficient at 1064 nm of from about 42 a.u. to about 110 a.u.,
wherein the polycrystalline NLO material is a boratephosphate.

14. The method of claim 13, wherein the polycrystalline NLO material is according to a formula $A_qB_yC_z$.

15. The method of claim 14, wherein A comprises an alkali metal or an alkaline earth metal.

16. The method of claim 14, wherein B comprises at least two of boron (B), carbon (C), or a transition metal.

17. The method of claim 14, wherein q and y are each from about 1 to 10.

18. The method of claim 14, wherein z is from 1 to 20.

19. The method of claim 13, wherein a first portion of the protocol comprises heating the vessel from a first temperature to a second temperature for a first period of time, and a second portion of the protocol comprises heating the vessel from a third temperature to a fourth temperature for a second period time, wherein the third temperature is higher than the second temperature, and wherein the second period of time is greater than the first.

* * * * *